(12) United States Patent
Ono

(10) Patent No.: US 8,717,470 B2
(45) Date of Patent: May 6, 2014

(54) SOLID-STATE IMAGING APPARATUS AND DIGITAL CAMERA

(75) Inventor: Koji Ono, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 12/846,414

(22) Filed: Jul. 29, 2010

(65) Prior Publication Data
US 2011/0058077 A1    Mar. 10, 2011

(30) Foreign Application Priority Data

Sep. 9, 2009    (JP) .................................. 2009-208523

(51) Int. Cl.
*H04N 3/14*    (2006.01)
*H04N 5/225*    (2006.01)
*H01L 27/00*    (2006.01)

(52) U.S. Cl.
USPC .......................... 348/294; 348/340; 250/208.1

(58) Field of Classification Search
USPC .......... 348/294, 335, 340, 373, 374; 257/704, 257/686; 250/208.1, 239; 396/55, 133, 144, 396/529, 535
See application file for complete search history.

(56) References Cited

U.S. PATENT DOCUMENTS

| | | | |
|---|---|---|---|
| 6,774,481 B2 | 8/2004 | Ono | 257/704 |
| 7,227,236 B1* | 6/2007 | Lee et al. | 257/433 |
| 2006/0093352 A1* | 5/2006 | Webster et al. | 396/529 |
| 2006/0279648 A1* | 12/2006 | Senba et al. | 348/294 |
| 2007/0053685 A1* | 3/2007 | Shibata et al. | 396/529 |
| 2010/0231766 A1* | 9/2010 | Moriya et al. | 348/294 |

FOREIGN PATENT DOCUMENTS

| | | |
|---|---|---|
| JP | 2003-037256 A | 2/2003 |
| JP | 2008-271026 A | 11/2008 |

* cited by examiner

*Primary Examiner* — Mekonnen Dagnew
(74) *Attorney, Agent, or Firm* — Fitzpatrick, Cella, Harper & Scinto

(57) ABSTRACT

The solid-state imaging apparatus illustrates a solid-state imaging element having a light receiving portion; a package which contains the solid-state imaging element; a light-transmissive member which is provided above the solid-state imaging element; and a partitioning member which is fixed to the package to isolate the light receiving portion of the solid-state imaging element from the surrounding portion of the light receiving portion of the solid-state imaging element.

10 Claims, 4 Drawing Sheets

SOLID-STATE IMAGING APPARATUS AND DIGITAL CAMERA

BACKGROUND OF THE INVENTION

1. Field of the Invention

The present invention relates to a solid-state imaging apparatus and a digital camera.

2. Description of the Related Art

The solid-state imaging apparatus includes a solid-state imaging element such as a CCD or CMOS sensor. The solid-state imaging apparatus generates an image signal by capturing light from an object into a light receiving portion of the solid-state imaging element. If a particle is attached to the light receiving portion, a black stain is captured in the image, causing a defective product. In addition, in consideration of particle movement by vibration or shock, particle attachment to not only the light receiving portion but also any portion other than the light receiving portion may cause a defective product. Example of the portions other than the light receiving portion include a surrounding portion of the light receiving portion of the solid-state imaging element, a bonding wire, or a cavity portion of a package containing the solid-state imaging element. This causes a problem with an increase in load of particle management and an increase in defective rate due to the particle. In light of the above, there has been proposed a technique disclosed in Japanese Patent Application Laid-Open No. 2003-37256, in which an adhesive layer is formed in the cavity portion of the package. The formation of the adhesive layer can reduce the movement of particles from the surrounding portion of the light receiving portion to the light receiving portion and thus can reduce the load of particle management and the defective rate due to the particles.

SUMMARY OF THE INVENTION

However, the solid-state imaging apparatus in which an adhesive layer is formed in the cavity portion of the package has the following problems. It is difficult to uniformly form the adhesive layer on a side wall of the cavity portion of the package. There is also a possibility that a bonding wire may be bent or cut when the adhesive layer is formed. In addition, there is a possibility that, depending on the shape of the adhesive layer, the light diffusely reflected from the adhesive layer is incident on the light receiving portion of the solid-state imaging element and may generate a ghost image. Moreover, the bonding wire is characterized in that particles are easily attached thereto due to its complicated shape. The adhesive layer for trapping the particles is provided outside the bonding wire and thus cannot trap the particles which directly move from the bonding wire to the light receiving portion, which may cause an image defect in the same manner as above.

An object of the present invention is to provide a solid-state imaging apparatus and a digital camera which can reduce the movement of particles from the surrounding portion of the light receiving portion to the light receiving portion by a simple method, without affecting the bonding wire, and without sacrificing optical performance.

A solid-state imaging apparatus according to the present invention comprises: a solid-state imaging element having a light receiving portion; a package holding the solid-state imaging element; a light transmitting member placed above the solid-state imaging element; and a partitioning member fixed to the package for isolating the light receiving portion of the solid-state imaging element from a peripheral portion of the light receiving portion of the solid-state imaging element.

The present invention can prevent particle movement from the surrounding portion of the light receiving portion of the solid-state imaging element to the light receiving portion by providing a partitioning member, and thereby can greatly reduce the load of particle management and the defective rate due to the particles.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
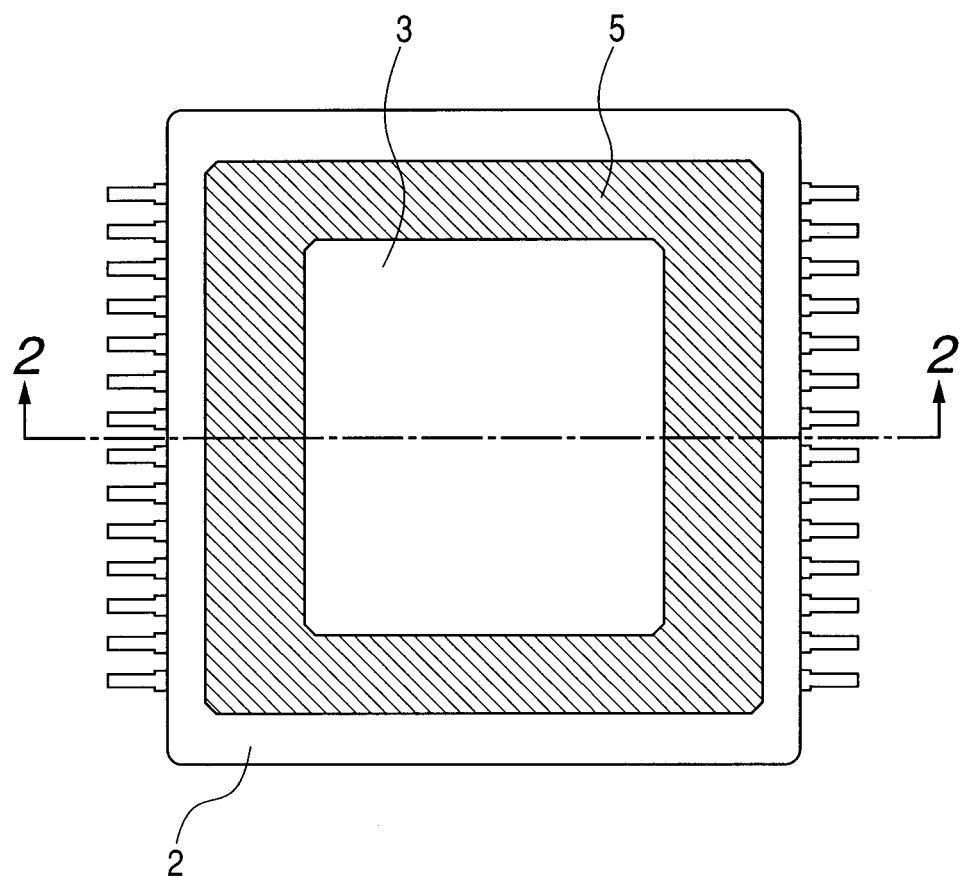
FIG. 1 is a plan view of a solid-state imaging apparatus according to a first embodiment of the present invention.
Figure 2:
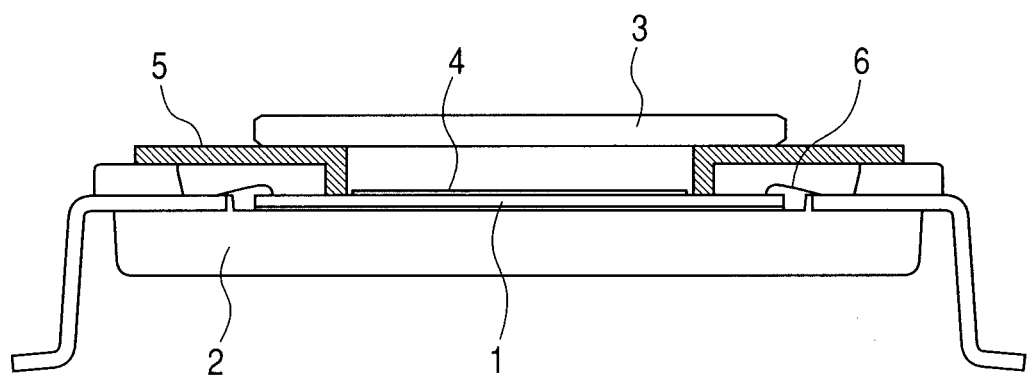
FIG. 2 is a sectional view of the solid-state imaging apparatus according to the first embodiment of the present invention.

FIGS. 1 and 2 each are a configuration view of a solid-state imaging apparatus according to a first embodiment of the present invention. FIG. 1 is a plan view as viewed from above; and FIG. 2 is a sectional view along line 2-2 of FIG. 1. The solid-state imaging apparatus according to the present embodiment includes: a solid-state imaging element 1 such as a CCD or CMOS sensor which performs photoelectric conversion; a package 2 which contains the solid-state imaging element 1; and a bonding wire 6 which electrically connects the solid-state imaging element 1 and the package 2. The solid-state imaging element 1 has a light receiving portion 4. In addition, a partitioning member 5 is fixedly bonded to the package 2 so as to cover the surrounding portion of the light receiving portion 4. The surrounding portion of the light receiving portion 4 has the bonding wire 6 which electrically connects the solid-state imaging element 1 and the package 2. Further, a light-transmissive member 3 for protecting the light receiving portion 4 is bonded to an upper surface of the partitioning member 5. The light-transmissive member 3 is provided above the solid-state imaging element 1. The light receiving portion 4 is spatially separated from the surrounding portion of the light receiving portion 4 by the partitioning member 5 and the light-transmissive member 3. The light receiving portion 4 is covered with the light-transmissive member 3 and the partitioning member 5. In addition, the surrounding portion of the light receiving portion 4 is also hermetically sealed by the partitioning member 5 and the package 2. The surrounding portion of the light receiving portion 4 is covered with the package 2 and the partitioning member 5. The partitioning member 5 is fixed to the package 2 to isolate the light receiving portion 4 from the surrounding portion of the light receiving portion 4. The present embodiment isolates the light receiving portion 4 from the surrounding portion of the light receiving portion 4 by the partitioning member 5, and thereby can prevent the movement of particles present around the light receiving portion 4, particularly, the particles attached to the bonding wire 6, to the light receiving portion 4. Note that the partitioning member 5 can be very easily implemented simply by preliminarily molding in an optimal shape and fixedly bonding to the package 2. Further, this does not affect the bonding wire 6 at all, and thus there is no possibility that the bonding wire 6 is bent or cut.

In addition, the present embodiment has another structural characteristic in that the partitioning member 5 is fixedly bonded only to the package 2. More specifically, an electrode for connecting the bonding wire 6 is formed on the surrounding portion of the light receiving portion 4 of the solid-state imaging element 1. The spacing between the electrode and the light receiving portion 4 is generally very narrow such as about 0.5 to 1.5 mm. If an attempt is made to fixedly bond the partitioning member to such a narrow region, adhesive extends to the light receiving portion 4 side, which reduces light-receiving capability. Therefore, the present embodiment can prevent a quality problem such as adhesive extending to the light receiving portion 4 without the need to use adhesive on the light receiving portion 4 by fixedly bonding the partitioning member 5 to the package 2. In addition, even the very thin partitioning member 5 can be fixedly bonded to a wide area of the package 2, thus causing no positional shift by shock or vibration. The partitioning member 5 is not limited to a particular shape as long as the partitioning member 5 can be bonded to the package 2 and is structured such that the partitioning member 5 can spatially separate the light receiving portion 4 from the other regions. For example, as illustrated in FIG. 2, the cross-sectional shape of the partitioning member 5 is preferably an L shape or a near L shape in terms of processability and costs. The partitioning member 5 is not limited to a particular material either, but a moldable material having some rigidity such as plastic and metal is preferable. The partitioning member 5 is not limited to a particular color either, but a color unlikely to reflect light such as black is preferable. The color unlikely to reflect light can suppress the light reflected on the partitioning member 5 from being incident on the light receiving portion 4 and thus can prevent a ghost from occurring. The package 2 is made from ceramic such as alumina or plastic such as thermosetting resin and thermoplastic resin. The light-transmissive member 3 is made from glass, acrylic resin, or the like. The bonding wire 6 is made from gold wire, aluminum wire, or the like.

The solid-state imaging apparatus of the present embodiment can prevent particle movement from the surrounding portion of the light receiving portion 4 to the light receiving portion 4 in a very simple configuration without damaging the bonding wire 6 and other members.

Second Embodiment

Figure 3:
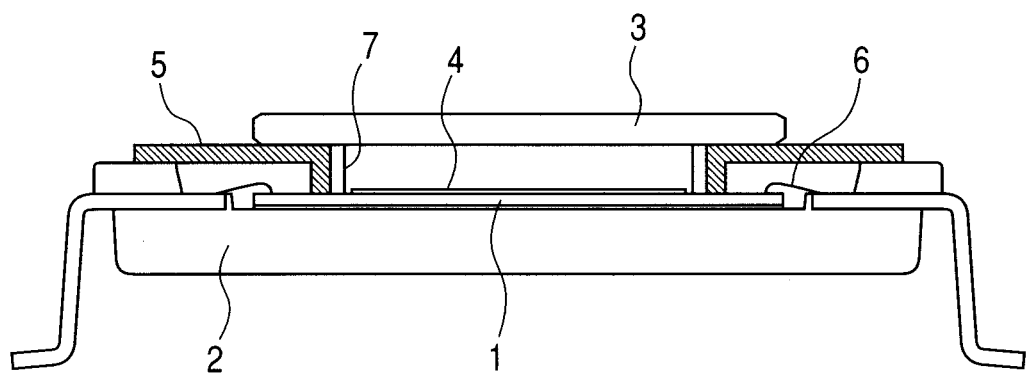
FIG. 3 is a sectional view of a solid-state imaging apparatus according to a second embodiment of the present invention.

FIG. 3 is a sectional view of a solid-state imaging apparatus according to a second embodiment of the present invention. The plan view of the solid-state imaging apparatus is the same as the plan view of FIG. 1. The solid-state imaging apparatus of the present embodiment includes: a solid-state imaging element 1; a package 2 which contains the solid-state imaging element 1; and a bonding wire 6 which electrically connects the solid-state imaging element 1 and the package 2. In addition, a partitioning member 5 is bonded to the package 2 so as to cover the surrounding portion of the light receiving portion 4. Further, a light-transmissive member 3 for protecting the light receiving portion 4 is bonded to an upper surface of the partitioning member 5. The partitioning member 5 has an adhesive 7 which is formed on a surface of the light receiving portion 4 side of the partitioning member 5. Particles adhere to the adhesive 7. Thus, even particles adhering to the partitioning member 5 adhere (are fixed) to the adhesive 7 and do not move to the light receiving portion 4, which can further reduce the particles moving to the light receiving portion 4. The adhesive 7 is made from rubber-based adhesive, acrylic-based adhesive, silicone-based adhesive, urethane-based adhesive, or the like. A hot-melt adhesive exhibits adhesiveness when heated and fixes particles. The adhesive can be formed on the partitioning member 5 in an easy manner such that a tape-shaped adhesive 7 is attached to a flat-shaped partitioning member 5 before molding and then the partitioning member 5 is molded in an optimal shape. Alternatively, first, the partitioning member 5 is molded, and then the adhesive 7 may be formed. In either method, the adhesive 7 can be formed on the partitioning member 5 in advance, which can prevent the bonding wire 6 from falling or being cut when the adhesive 7 is formed.

The solid-state imaging apparatus of the present embodiment can fix particles attached to the partitioning member 5 itself by the adhesive 7 formed on the partitioning member 5. Therefore, the solid-state imaging apparatus of the present embodiment can prevent particle movement not only from the surrounding portion of the light receiving portion 4 but also from the partitioning member 5 to the light receiving portion 4.

Third Embodiment

Figure 4:
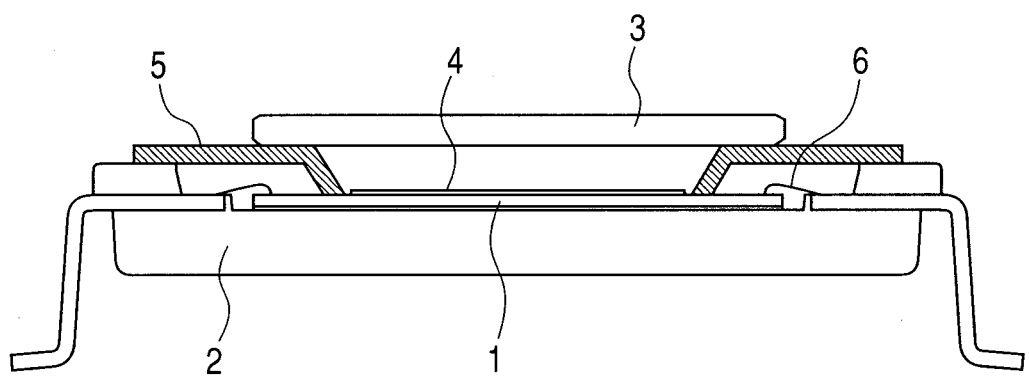
FIG. 4 is a sectional view of a solid-state imaging apparatus according to a third embodiment of the present invention.

FIG. 4 is a sectional view of a solid-state imaging apparatus according to a third embodiment of the present invention. The plan view of the solid-state imaging apparatus is the same as the plan view of FIG. 1. The solid-state imaging apparatus of the present embodiment includes: a solid-state imaging element 1; a package 2 which contains the solid-state imaging element 1; and a bonding wire 6 which electrically connects the solid-state imaging element 1 and the package 2. In addition, a partitioning member 5 is bonded to the package 2 so as to cover the surrounding portion of the light receiving portion 4. Further, a light-transmissive member 3 for protecting the light receiving portion 4 is bonded to an upper surface of the partitioning member 5. The partitioning member 5 is arranged such that a surface of the partitioning member 5 on the light receiving portion 4 side is inclined to a surface of the light receiving portion 4. The present embodiment is characterized in that the partitioning member 5 is inclined inward from the light-transmissive member 3 side to the solid-state imaging element 1 side. This can prevent light reflected on the partitioning member 5 from being incident on the light receiving portion 4 and thus can suppress generation of ghost. The inclination angle of the partitioning member 5 is set such that incident light focusing on the light receiving portion 4 is not blocked by the partitioning member 5 and no ghost is generated by light reflected on an inclined surface of the partitioning member 5. Specifically, it is preferable to set the partitioning member 5 to an inclination angle inclined at 20° to 50° from the vertical state. The inclination of the partitioning member 5 can be easily inclined, for example, by molding.

The solid-state imaging apparatus of the present embodiment can prevent particle movement from the surrounding portion of the light receiving portion 4 to the light receiving portion 4 without reducing optical performance in a simple configuration of arranging the partitioning member 5 having an optimal inclined shape.

Fourth Embodiment

Figure 5:
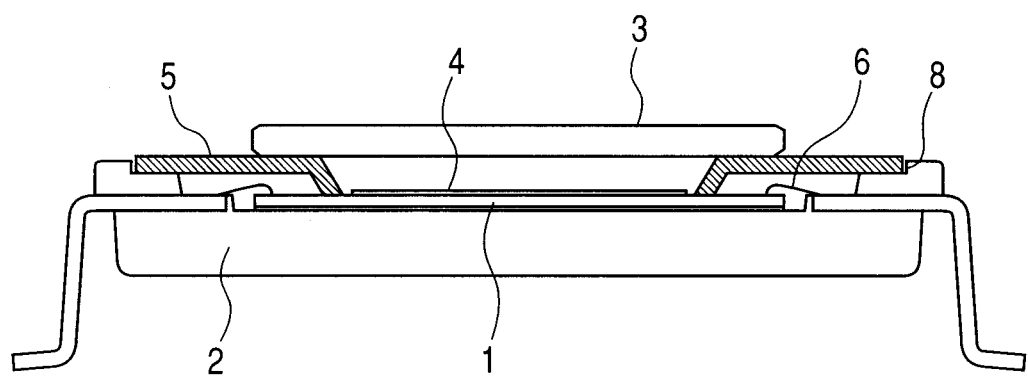
FIG. 5 is a sectional view of a solid-state imaging apparatus according to a fourth embodiment of the present invention.

FIG. 5 is a sectional view of a solid-state imaging apparatus according to a fourth embodiment of the present invention. The plan view of the solid-state imaging apparatus is the same as the plan view of FIG. 1. The solid-state imaging apparatus of the present embodiment includes: a solid-state imaging element 1; a package 2 which contains the solid-state imaging element 1; and a bonding wire 6 which electrically connects the solid-state imaging element 1 and the package 2. The present embodiment is characterized in that a step shape portion 8 is provided as a positioning unit on the partitioning member 5 side of the package 2. More specifically, the partitioning member 5 is fitted and bonded to the step shape portion 8 of the package 2 so as to cover the surrounding portion of the light receiving portion 4. Further, a light-transmissive member 3 for protecting the light receiving portion 4 is bonded to an upper surface of the partitioning member 5. The partitioning member 5 can be fitted to the step shape portion 8 and thus the partitioning member 5 can be easily positioned as well as can reliably prevent contact to the bonding wire 6. The present embodiment uses the step shape portion 8 provided on the package 2 as the positioning unit, but a fitted shape such as a protrusion and a groove is formed on either one or both of the package 2 and the partitioning member 5 may be formed as the positioning unit. Note that at least one positioning unit can be enough to exert its effects. The partitioning member 5 and the package 2 are mutually positioned by the step shaped fitting portion. The use of the positioning unit allows the partitioning member 5 to be arranged with a good accuracy between the electrode provided in the surrounding portion of the light receiving portion 4 and the light receiving portion 4 without the need to use an advanced positioning method such as positioning by image recognition using a camera. Thus, apparatus costs can be reduced.

The solid-state imaging apparatus of the present embodiment can easily position the partitioning member 5 in a predetermined position by the positioning unit provided in the package 2.

Fifth Embodiment

Figure 6:
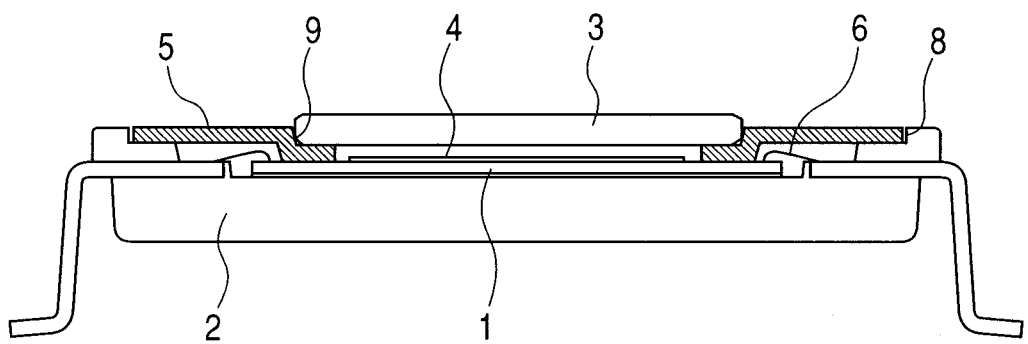
FIG. 6 is a sectional view of a solid-state imaging apparatus according to a fifth embodiment of the present invention.

FIG. 6 is a sectional view of a solid-state imaging apparatus according to a fifth embodiment of the present invention. The plan view of the solid-state imaging apparatus is the same as the plan view of FIG. 1. The solid-state imaging apparatus of the present embodiment includes: a solid-state imaging element 1; a package 2 which contains the solid-state imaging element 1; and a bonding wire 6 which electrically connects the solid-state imaging element 1 and the package 2. The present embodiment is characterized in that a step shape portion 9 is provided as a positioning unit of the light-transmissive member 3 also on the partitioning member 5. More specifically, the partitioning member 5 is fitted and bonded to the step shape portion 8 of the package 2 so as to cover the surrounding portion of the light receiving portion 4. Further, a light-transmissive member 3 for protecting the light receiving portion 4 is fitted and bonded to the step shape portion 9 of the partitioning member 5. The partitioning member 5 is positioned to the light-transmissive member 3 by the step shaped fitting portion. The light-transmissive member 3 can be easily positioned by fitting the light-transmissive member 3 to the step shape portion 9.

The solid-state imaging apparatus of the present embodiment can easily position the light-transmissive member 3 in a predetermined position by the step shape portion 9 provided as the positioning unit in the partitioning member 5.

Sixth Embodiment

Figure 7:
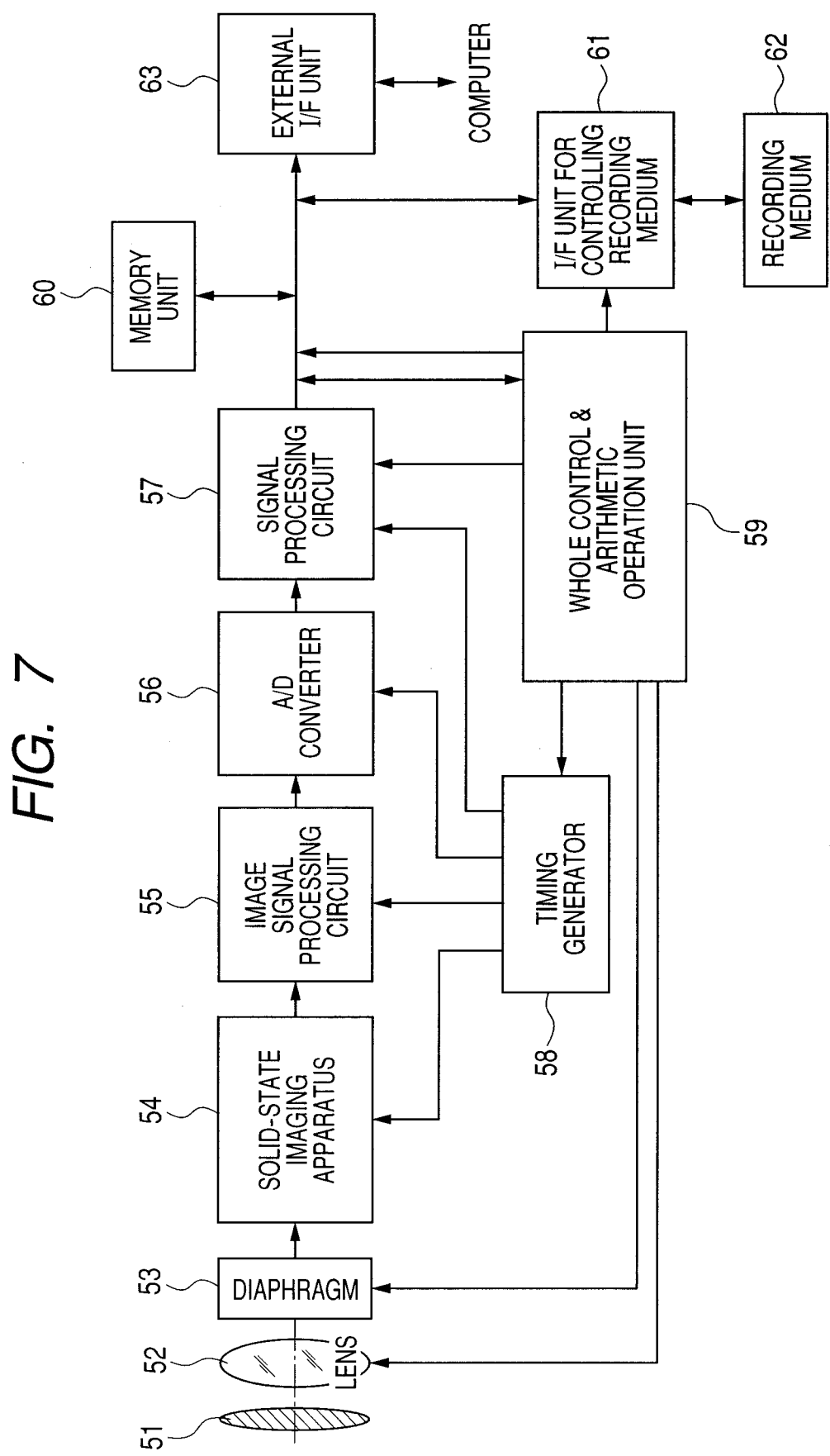
FIG. 7 is a configuration example of a digital camera according to a sixth embodiment of the present invention.

FIG. 7 is a block diagram illustrating a configuration example of a digital camera according to a sixth embodiment of the present invention. The digital camera has one solid-state imaging apparatus 54 according to any one of the first to fifth embodiments. A barrier 51 protects a lens 52 and serves also as a main switch. The lens 52 focuses an optical image of an object on a solid-state imaging apparatus 54. A diaphragm 53 varies the amount of light passing through the lens 52. The solid-state imaging apparatus 54 fetches the object focused by the lens 52 as an image signal. An image signal processing circuit 55 processes the image signal output from the solid-state imaging apparatus 54. An A/D converter 56 performs analog to digital conversion on the image signal output from the image signal processing circuit 55. A signal processing unit 57 performs various corrections on the image data output from the A/D converter 56 and performs data compression. A timing generator 58 outputs various timing signals to the solid-state imaging apparatus 54, the image signal processing circuit 55, and the A/D converter 56 and the signal processing unit 57. A whole control & arithmetic operation unit 59 controls various arithmetic operations and the entire digital camera. A memory unit 60 temporarily stores image data. An interface (I/F) unit 61 performs recording or reading to and from a recording medium 62. The recording medium 62 is a removable recording medium such as a semiconductor memory for recording or reading image data. An interface (I/F) unit 63 communicates with an external computer and the like.

Next, the operation of the digital camera at shooting in the above described configuration will be described. When the barrier 51 is opened, the main power source is turned on. Then, the control power sources are turned on and further power sources for the imaging circuits such as the A/D converter 56 are turned on. Then, in order to control the exposure amount, the whole control & arithmetic operation unit 59 opens the diaphragm 53. Then, the signal output from the solid-state imaging apparatus 54 through the image signal processing circuit 55 is converted by the A/D converter 56 and then input to the signal processing unit 57. The whole control & arithmetic operation unit 59 performs exposure operation based on the data. The whole control & arithmetic operation unit 59 determines brightness based on the photometrical measurement and controls the diaphragm 53 according to the result. Then, the whole control & arithmetic operation unit 59 extracts a high-frequency component based on the signal output from the solid-state imaging apparatus 54 and calculates the distance to the object. Subsequently, the whole control & arithmetic operation unit 59 drives the lens 52 to determine whether a focus point is focused or not. If a determination is made that the focus point is not focused, the whole control & arithmetic operation unit 59 drives the lens 52 to measure the distance again. After a confirmation is made that the focus point is focused, the exposure starts. When the exposure is finished, the image signal output from the solid-state imaging apparatus 54 through the image signal processing circuit 55 is subjected to A/D conversion by the A/D converter 56, passes through the signal processing unit 57 and then is written to the memory unit 60 by the whole control & arithmetic operation unit 59. Subsequently, the data stored in the memory unit passes through the interface (I/F) unit 61 for controlling recording medium and is recorded in the removable recording medium 62 such as a semiconductor memory under control of the whole control & arithmetic operation unit 59. Alternatively, the data may pass through the external interface (I/F) unit 63 to be input directly to the computer for image processing.

The first to sixth embodiments can prevent particle movement from the surrounding portion of the light receiving portion 4 of the solid-state imaging element 1 to the light receiving portion 4 without affecting the bonding wire 6 and without sacrificing optical performance by providing the partitioning member. Thus, the embodiments can greatly reduce the load of particle management and the defective rate due to the particles.

Note that it is to be understood that the above embodiments illustrate only specific examples to practice the present invention and the technical scope of the present invention should not be limited to these embodiments. More specifically, the present invention can be practiced in various forms without departing from the technical ideas or the major characteristics of the present invention. The above embodiments can be used in various combinations.

OTHER EMBODIMENTS

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-208523, filed Sep. 9, 2009 which is hereby incorporated by reference herein in its entirety.

What is claimed is:

1. A solid-state imaging apparatus comprising:
a solid-state imaging element including a light receiving portion and a peripheral portion outside of the light receiving portion;
a package configured to have a cavity portion to hold the solid-state imaging element;
a bonding wire for electrically connecting the peripheral portion to the package;
a light transmitting member positioned spaced from the solid-state imaging element in a first direction, to form a space between the light receiving portion and the light transmitting member; and
a partitioning member for isolating the light receiving portion from surroundings of the light receiving portion,
wherein the package includes a convex part that is positioned spaced from the solid-state imaging element in a second direction crossing the first direction, and the convex part forms a side wall of the cavity portion,
wherein the partitioning member includes a first part that touches the solid-state imaging element, a second part and a third part that is bonded to the convex part, and the partitioning member extends from the first part to the third part, through the second part without contacting the bonding wire, and
wherein the first part is positioned between the space and the bonding wire in the second direction, and the second part is positioned so that the bonding wire is positioned between the second part and the package in the first direction.

2. The solid-state imaging apparatus according to claim 1, wherein the first part of the partitioning member includes an adhesive for fixing a particle.

3. The solid-state imaging apparatus according to claim 1, wherein the first part of the partitioning member includes, at a side of the space, a face inclined at an angle of 20° to 50° from a direction vertical to the light receiving surface of the light receiving portion.

4. The solid-state imaging apparatus according to claim 1, wherein the convex part of the package includes a step shape fitting portion, and the partitioning member is fitted and bonded to the step shape fitting portion.

5. The solid-state imaging apparatus according to claim 1, wherein the partitioning member includes a step shape fitting portion, and the light transmitting member is fitted and bonded to the step shape fitting portion.

6. The solid-state imaging apparatus according to claim 1, wherein the bonding wire is positioned between the first part of the partitioning member and the convex part in the second direction.

7. The solid-state imaging apparatus according to claim 1, wherein the light receiving portion is covered by the light transmitting member and the partitioning member, and the peripheral portion is covered by the package and the partitioning member.

8. The solid-state imaging apparatus according to claim 1, wherein the apparatus is incorporated in a digital camera that includes a lens for imaging light in the solid-state imaging apparatus.

9. The solid-state imaging apparatus according to claim 1, wherein the light transmitting member is bonded to the partitioning member.

10. The solid-state imaging apparatus according to claim 1, wherein the partitioning member is made of preliminarily molded plastic or metal.

* * * * *